US011581406B2

(12) United States Patent
Cea et al.

(10) Patent No.: US 11,581,406 B2
(45) Date of Patent: Feb. 14, 2023

(54) METHOD OF FABRICATING CMOS FINFETS BY SELECTIVELY ETCHING A STRAINED SIGE LAYER

(71) Applicant: Intel Corporation, Santa Clara, CA (US)

(72) Inventors: Stephen M. Cea, Hillsboro, OR (US); Roza Kotlyar, Portland, OR (US); Harold W. Kennel, Portland, OR (US); Anand S. Murthy, Portland, OR (US); Glenn A. Glass, Portland, OR (US); Kelin J. Kuhn, Aloha, OR (US); Tahir Ghani, Protland, OR (US)

(73) Assignee: Daedalus Prime LLC, Bronxville, NY (US)

( * ) Notice: Subject to any disclaimer, the term of this patent is extended or adjusted under 35 U.S.C. 154(b) by 0 days.

(21) Appl. No.: 17/453,088

(22) Filed: Nov. 1, 2021

(65) Prior Publication Data

US 2022/0059656 A1    Feb. 24, 2022

Related U.S. Application Data

(60) Continuation of application No. 16/148,621, filed on Oct. 1, 2018, now Pat. No. 11,195,919, which is a
(Continued)

(51) Int. Cl.
*H01L 29/10* (2006.01)
*H01L 29/66* (2006.01)
(Continued)

(52) U.S. Cl.
CPC .......... *H01L 29/1054* (2013.01); *H01L 21/823807* (2013.01); *H01L 21/823821* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 7,348,284 B2   3/2008   Doyle et al.
7,767,560 B2   8/2010   Jin et al.
(Continued)

FOREIGN PATENT DOCUMENTS

CN   1838416 A     9/2006
CN   102956453 A   3/2013
(Continued)

OTHER PUBLICATIONS

European Search Report for European Patent Application No. 13899638, dated Jul. 10, 2017, 9 pages.
(Continued)

*Primary Examiner* — Younes Boulghassoul
(74) *Attorney, Agent, or Firm* — Kinney & Lange, P.A.

(57) ABSTRACT

Techniques and methods related to strained NMOS and PMOS devices without relaxed substrates, systems incorporating such semiconductor devices, and methods therefor may include a semiconductor device that may have both n-type and p-type semiconductor bodies. Both types of semiconductor bodies may be formed from an initially strained semiconductor material such as silicon germanium. A silicon cladding layer may then be provided at least over or on the n-type semiconductor body. In one example, a lower portion of the semiconductor bodies is formed by a Si extension of the wafer or substrate. By one approach, an upper portion of the semiconductor bodies, formed of the strained SiGe, may be formed by blanket depositing the strained SiGe layer on the Si wafer, and then etching through
(Continued)

the SiGe layer and into the Si wafer to form the semiconductor bodies or fins with the lower and upper portions.

17 Claims, 10 Drawing Sheets

Related U.S. Application Data division of application No. 15/024,348, filed as application No. PCT/US2013/075452 on Dec. 16, 2013, now Pat. No. 10,109,711.

(51) Int. Cl.
| | |
|---|---|
| *H01L 21/84* | (2006.01) |
| *H01L 21/8238* | (2006.01) |
| *H01L 29/161* | (2006.01) |
| *H01L 27/092* | (2006.01) |
| *H01L 29/778* | (2006.01) |
| *H01L 29/165* | (2006.01) |
| *H01L 27/12* | (2006.01) |
| *H01L 29/78* | (2006.01) |
| *H01L 29/04* | (2006.01) |

(52) U.S. Cl.
CPC ........ *H01L 21/845* (2013.01); *H01L 27/0924* (2013.01); *H01L 27/1211* (2013.01); *H01L 29/161* (2013.01); *H01L 29/165* (2013.01); *H01L 29/66431* (2013.01); *H01L 29/66818* (2013.01); *H01L 29/7781* (2013.01); *H01L 29/7782* (2013.01); *H01L 29/7842* (2013.01); *H01L 29/7848* (2013.01); *H01L 29/045* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/1054; H01L 29/7842; H01L 21/823807; H01L 29/7847; H01L 29/7848; H01L 29/7849; H01L 21/0245; H01L 21/02532; H01L 21/02381; H01L 29/161; H01L 29/165; H01L 29/045; H01L 21/823412
See application file for complete search history.

(56) References Cited

U.S. PATENT DOCUMENTS

| | | | |
|---|---|---|---|
| 8,558,279 B2* | 10/2013 | Cea | H01L 29/1054 |
| | | | 257/190 |
| 9,640,537 B2 | 5/2017 | Goel et al. | |
| 2004/0195624 A1 | 10/2004 | Liu et al. | |
| 2005/0224800 A1 | 10/2005 | Lindert et al. | |
| 2006/0157788 A1 | 7/2006 | Joshi et al. | |
| 2006/0266996 A1* | 11/2006 | Irisawa | H01L 29/785 |
| | | | 257/19 |
| 2007/0090416 A1 | 4/2007 | Doyle et al. | |
| 2008/0064149 A1* | 3/2008 | Cohen | H01L 29/785 |
| | | | 257/E21.442 |
| 2008/0135888 A1 | 6/2008 | Lee et al. | |
| 2009/0072271 A1 | 3/2009 | Gomez et al. | |
| 2009/0085027 A1 | 4/2009 | Jin et al. | |
| 2010/0163926 A1 | 7/2010 | Hudait et al. | |
| 2011/0147811 A1* | 6/2011 | Kavalieros | H01L 29/7851 |
| | | | 257/E21.409 |
| 2011/0180851 A1 | 7/2011 | Doyle et al. | |
| 2012/0241818 A1 | 9/2012 | Kavalieros et al. | |
| 2012/0319211 A1 | 12/2012 | Van Dal et al. | |
| 2013/0248942 A1 | 9/2013 | Okano | |
| 2013/0270512 A1 | 10/2013 | Chau et al. | |
| 2013/0270641 A1 | 10/2013 | Chi | |
| 2013/0277683 A1 | 10/2013 | Then et al. | |
| 2014/0264488 A1 | 9/2014 | Fronheiser et al. | |
| 2015/0144962 A1* | 5/2015 | Rim | H01L 29/161 |
| | | | 257/190 |
| 2015/0318354 A1 | 11/2015 | Yin et al. | |
| 2017/0141226 A1 | 5/2017 | Jacob | |
| 2017/0141227 A1 | 5/2017 | Jacob | |

FOREIGN PATENT DOCUMENTS

| | | |
|---|---|---|
| KR | 100836761 B1 | 6/2008 |
| TW | I231994 B | 5/2005 |
| TW | 201225216 A | 6/2012 |
| TW | 201332104 A | 8/2013 |

OTHER PUBLICATIONS

First Office Action for Chinese Patent Application No. 201380080947.1, dated Nov. 6, 2018, 13 pages.
First Office Action for Taiwanese Patent Application No. 103139371, dated Dec. 9, 2015, 7 Pages.
International Preliminary Report on Patentability for International Patent Application No. PCT/US2013/075452, dated Jun. 30, 2016, 8 pages.
International Search Report and Written Opinion for International Patent Application No. PCT/US2013/075452, dated Sep. 15, 2014, 13 pages.

* cited by examiner

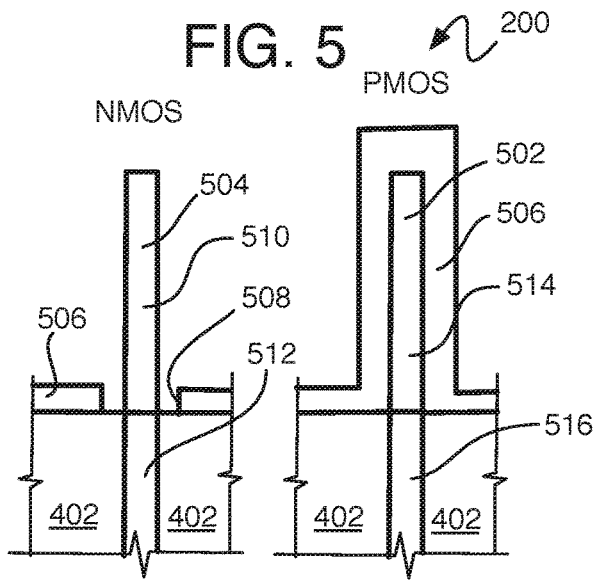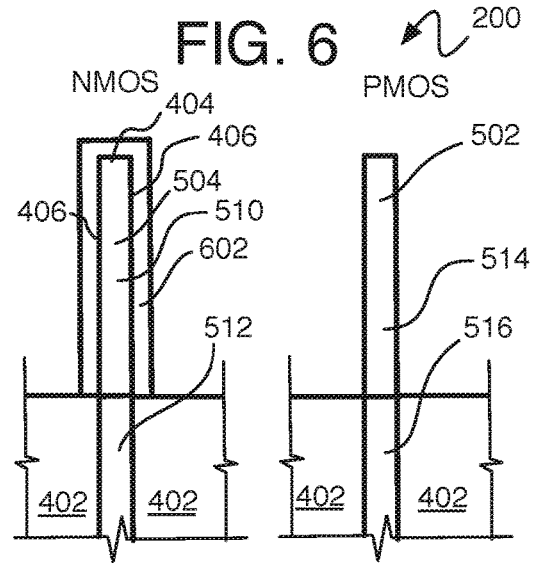

- Form at least one p-type semiconductor body and at least one n-type semiconductor body over a substrate
  702
- Form a lower portion of the semiconductor bodies comprising Form trenches in the substrate
  704
- Form an upper portion of the semiconductor bodies on the lower portions and comprising non-relaxed SiGe with (110) crystal orientation facing a channel flow direction, and a (110) upper facing surface
  706
- Form a cladding layer comprising silicon on at least one of the n-type semiconductor bodies
  708
- Form a cladding layer on at least one of the p-type semiconductor bodies.
  710

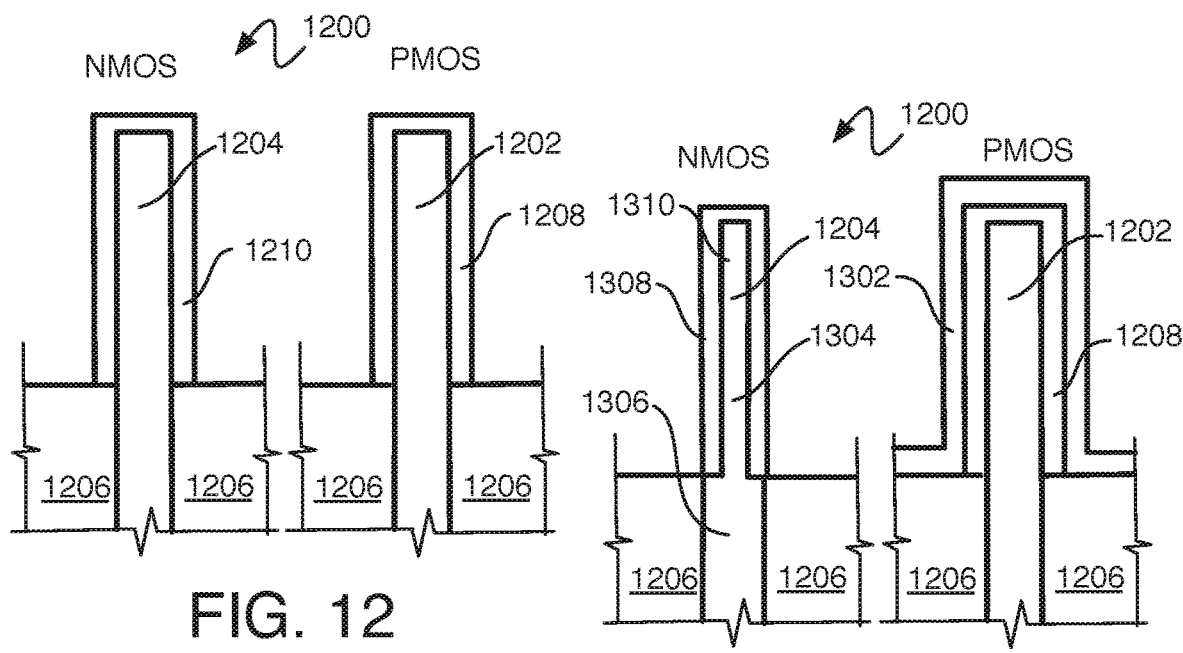
FIG. 12
FIG. 13
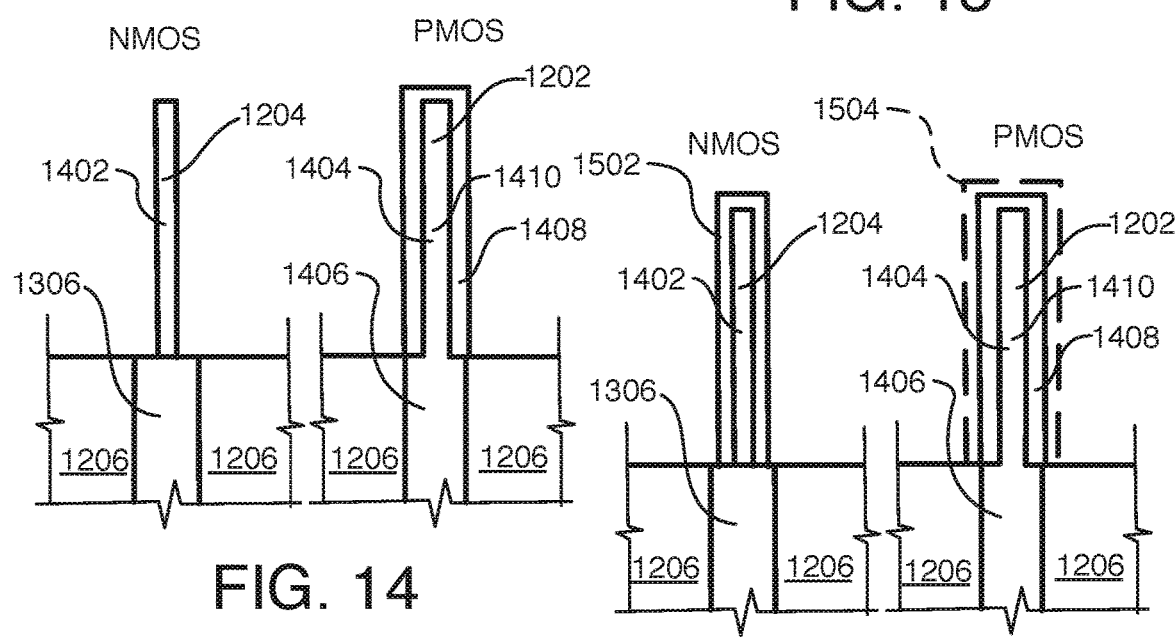
FIG. 14
FIG. 15

ISO FIG. 17  FIG. 18 Nested
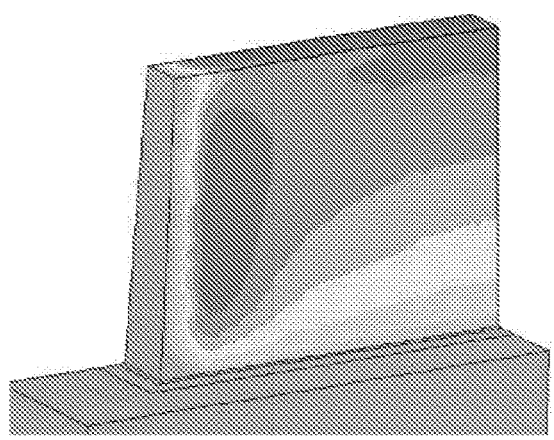
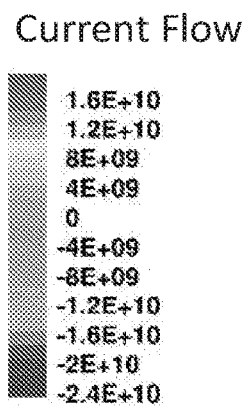
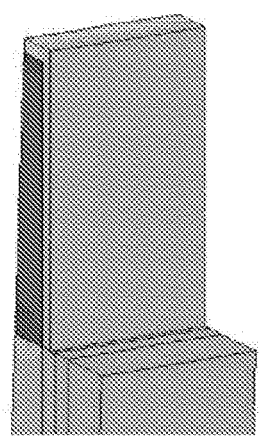
Current Flow
1.6E+10
1.2E+10
8E+09
4E+09
0
-4E+09
-8E+09
-1.2E+10
-1.6E+10
-2E+10
-2.4E+10
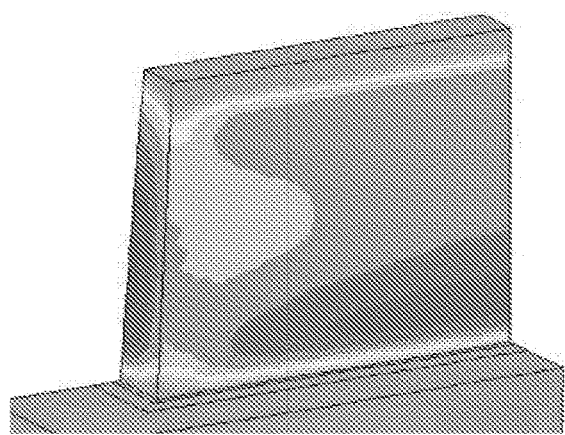
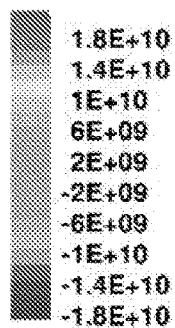
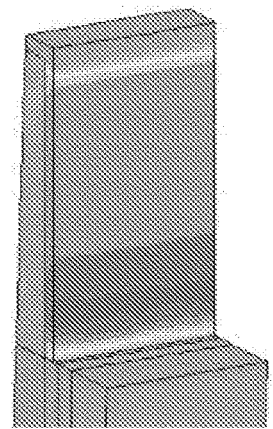
Vertical
1.8E+10
1.4E+10
1E+10
6E+09
2E+09
-2E+09
-6E+09
-1E+10
-1.4E+10
-1.8E+10
FIG. 19  FIG. 20
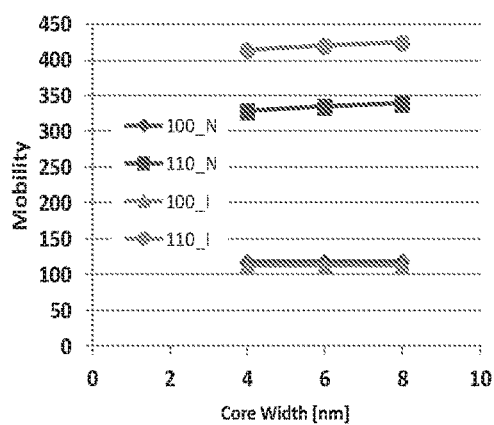
FIG. 21 Mobility
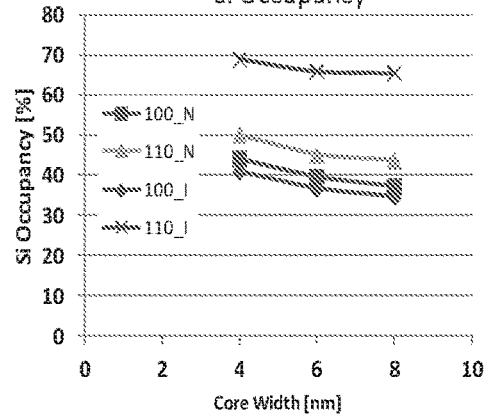
FIG. 22 Si Occupancy

METHOD OF FABRICATING CMOS FINFETS BY SELECTIVELY ETCHING A STRAINED SIGE LAYER

CROSS-REFERENCE TO RELATED APPLICATION(S)

The present application is a continuation of U.S. Non-Provisional patent application Ser. No. 16/148,621, entitled "CMOS FinFET Device having Strained SiGe Fins and a Strained Si Cladding Layer on the NMOS Channel," by Stephen M. Cea, et al., filed Oct. 1, 2018, which is a divisional of U.S. Non-Provisional patent application Ser. No. 15/024,348, entitled "NMOS and PMOS Strained Devices without Relaxed Substrates," by Stephen M. Cea, et al., file Mar. 23, 2016, which is a National Stage Entry of International Priority Application No. PCT/US2013/075452 filed Dec. 16, 2013. Each of the above referenced applications is hereby incorporated in their entirety by reference.

BACKGROUND

A typical metal-oxide-semiconductor field-effect transistor (MOSFET) may include a semiconductor (for example, silicon), electrodes to contact a source region and a drain region, and an electrode to contact or couple with a gate. A FinFET is a MOSFET built around a thin strip of semiconductor material (generally referred to as the fin) extending upward from a plate shaped substrate. One end of the fin is the source region, while the opposite end of the fin is the drain region. The middle area of the fin forms a channel region which is covered by a gate dielectric and a gate electrode. The conductive channel of the device resides on the outer sides of the fin beneath the gate dielectric. Specifically, current runs along and within both sidewalls of the fin (the sides perpendicular to the substrate surface) as well as along the top of the fin (the side parallel to the substrate surface). Because the conductive channel of such configurations essentially resides along the three different outer, planar regions of the fin, such a FinFET is sometimes referred to as a trigate FinFET. Other types of FinFET configurations are also available, such as so-called double-gate FinFETs, in which the conductive channel principally resides only along the two sidewalls of the fin (and not along the top of the fin). A complimentary metal-oxide semiconductor (CMOS) has dual fins, one fin for a p-type transistor (the PMOS), and another fin for an n-type transistor (the NMOS). The dual fins are separated by an insulating oxide layer on an integrated circuit for example. The carrier mobility on such fin-based transistors may still be improved.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 2-6 are cross-sectional views of example transistors as particular fabrication operations are performed;

FIG. 7 is a flow chart for fabricating p-type and n-type transistors;

FIGS. 12-15 are cross-sectional views of example transistors as particular fabrication operations are performed;

FIG. 17-20 are graphs showing the simulated stress in the current flow and vertical directions for both isolated and nested transistors;

FIGS. 21-22 are graphs showing the electron mobility and occupancy in the Si layers for different crystal lattice faces for both isolated and nested transistors;

DETAILED DESCRIPTION

Figure 1:
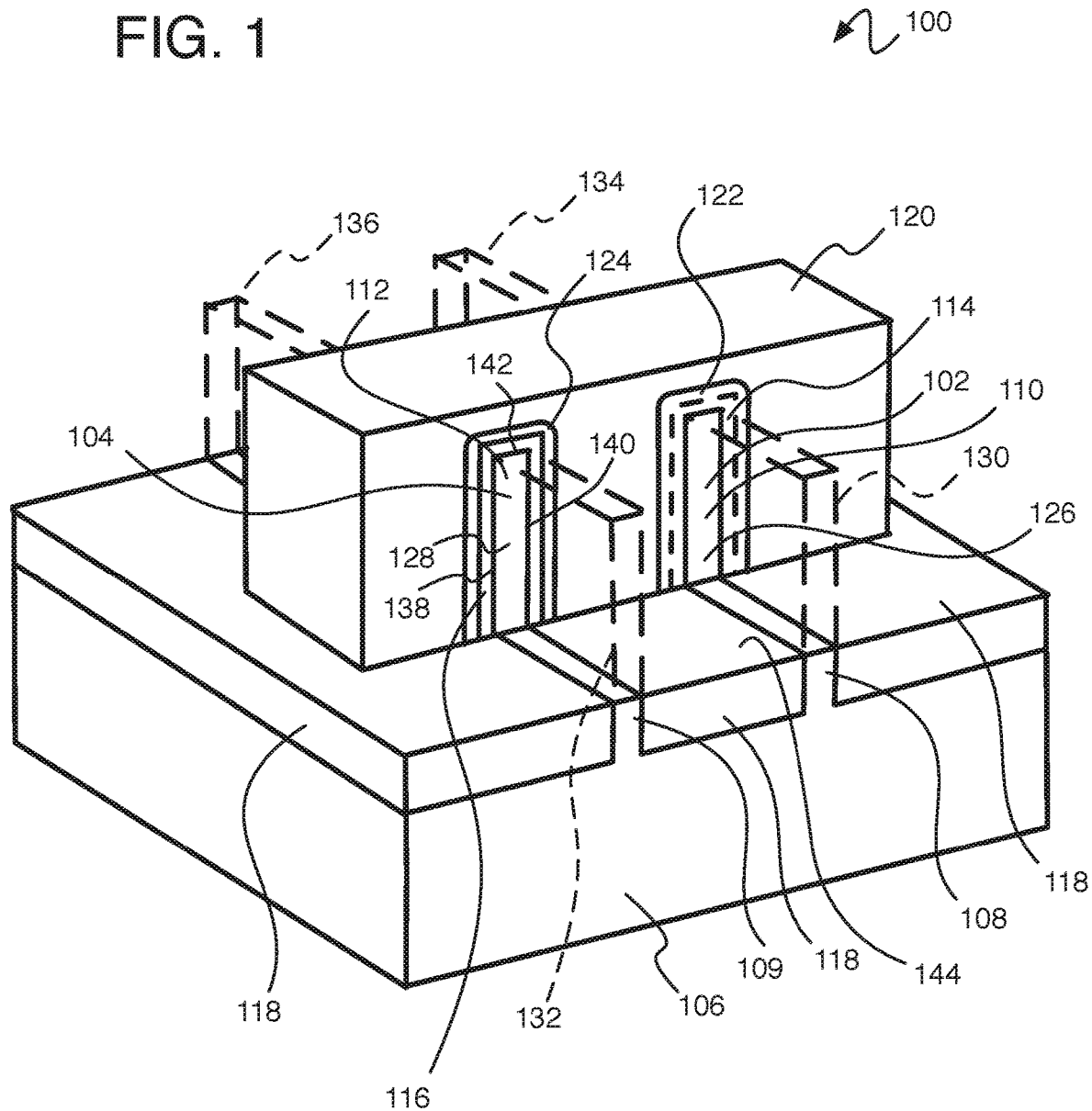
FIG. 1 is an upper perspective view of a dual complimentary metal-oxide semiconductor device.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other implementations may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an implementation" or "in one implementation" means that a particular feature, structure, function, or characteristic described in connection with the implementation is included in at least one implementation of the invention. Thus, the appearances of the phrase "in an implementation" in various places throughout this specification are not necessarily referring to the same implementation of the invention. Furthermore, the particular features, structures, functions, or characteristics may be combined in any suitable manner in one or more implementations. For example, a first implementation may be combined with a second implementation anywhere the two implementations are not specified to be mutually exclusive.

The terms "coupled" and "connected," along with their derivatives, may be used herein to describe structural relationships between components. It should be understood that these terms are not intended as synonyms for each other. Rather, in particular implementations, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (for example, as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Additionally, the terms "under" or "over" or "down" or "up" and/or similar terms relating to relative position are meant to express internal relative positioning between components and do not necessarily mean upward or downward relative to the earth unless stated otherwise.

Devices, microprocessors, apparatuses, computing platforms, and methods are described below related to n-type and p-type metal oxide semiconductor (NMOS and PMOS) devices without relaxed substrates.

Many semiconductor devices have both p-type and n-type fins, which may or may not be positioned relatively close to each other on a wafer. One such example is a complementary metal oxide semiconductor (CMOS) device that may have dual fins including a p-type fin adjacent an n-type fin separated by an insulation layer. Difficulties occur when trying to increase the efficiency of both fin types because the p-type fins and n-type fins have different characteristics. Germanium (Ge) for example is often used to increase the hole mobility on p-type fins but may reduce electron mobility on n-type fins, and so forth. Thus, it is desirable to treat the p-type and n-type fins differently.

This problem may arise when applying a strained cladding layer to the fins. A strained cladding layer may be deposited on the fin in order to increase the mobility of the charge carriers at the interface between the outer walls of the fins and the gate dielectric, which may increase the speed in which the semiconductor device can operate, thereby increasing performance and lowering energy consumption. A strained cladding layer is formed when a material is pseudomorphically grown on a fin (called the core or semiconductor body herein), and the core and the cladding layer have different lattice constants. The difference in lattice constant between the core and clad layers causes both the core and the cladding layer to be strained. The amount of strain and direction of the strain in each will be determined by their thicknesses, relative stiffness, location of their free surfaces, and the degree of lattice mismatch between the deposited cladding layer material and the underlying fin core.

In order to obtain high carrier mobility, another objective is to form the fin and cladding layer with a (110) crystal orientation facing a channel flow direction on the transistor. A transistor or semiconductor device often uses a wafer with a (100) surface (or in other words, a (100) surface exposed and facing upward for direct deposition of other layers upon the surface) as the base of the device. In that case, a relaxed layer of material may be deposited on the wafer to form the fins and may have the correct (110) orientation, which in turn may be adopted by the pseudomorphically grown cladding layer. Relaxation of the material forming the fins, however, may require deposition of multiple buffer layers or aspect ratio trapping (ART) to control the relaxation causing defects. This process may be relatively complex, time consuming, and costly. Thus, a way to provide different cladding layers for both NMOS and PMOS devices, and strained layers with high mobility and drive currents for both NMOS and PMOS layers without the use of initially relaxed layers, is desired.

The difficulties mentioned above may be solved by using a wafer with a (110) surface and appropriate strained layers. With a (110) upwardly facing, or top, surface, a (110) crystal orientation also faces the channel flow direction, and positions (100) sidewall surfaces on the fins. While generally a (110) surface is not considered advantageous for a PMOS device, the strain provided herein overcomes this deficiency. An initially, strained (or in other words, non-relaxed) fin core grown upon such a (110) wafer will conform to the same or similar orientation as the wafer. The NMOS fin also may have Si cladding, and the PMOS fin may have similar cladding of different depths or a cladding layer of different material, that results in high electron and hole transport. The PMOS could also be made from the core layer and cladding only used for the NMOS case.

More specifically, a semiconductor device may have both n-type and p-type semiconductor bodies or fins, by one example, formed on a semiconductor substrate. Both types of semiconductor bodies may be formed from an initially strained semiconductor material such as silicon germanium (SiGe). A silicon (Si) cladding layer may then be provided at least over or on the n-type semiconductor body. In one example, a lower portion of the semiconductor bodies is formed by a Si extension of the wafer or substrate. By one approach, an upper portion of the semiconductor bodies, formed of the strained SiGe, may be formed by blanket depositing the strained (or in other words, non-relaxed) SiGe layer on the Si wafer, and then etching through the SiGe layer and into the Si wafer to form the semiconductor bodies or fins with the lower and upper portions. By a different approach, the entire semiconductor fins may be initially formed of silicon and then upper portions of the semiconductor fins may be diffused with SiGe to transform the upper portions into substantially, initially strained SiGe portions. Covering the p-type semiconductor bodies for at least part of this process permits the p-type semiconductor bodies to have a different upper portion including a Si inner region or core and an outer SiGe layer or cladding. A Si cladding layer may be placed over the n-type semiconductor body or both the n-type and p-type semiconductor bodies.

Referring to FIG. 1, various implementations described herein overcome the difficulties mentioned above, and in one illustrated example, an integrated circuit may have a semiconductor device 100 that includes semiconductor bodies 102 and 104, also referred to as semiconductor fins, fin portions, or cores. The semiconductor bodies 102 and 104 may be formed on a semiconductor substrate 106, such as a silicon (Si), silicon germanium (SiGe), or Group III-V substrate. The semiconductor bodies 102 and 104 may include lower portions 108 and 109 that extend directly from the substrate 106. The semiconductor bodies 102 and 104 may also include upper portions 110 and 112 that consist of strained SiGe. In this example, the semiconductor body 102 is p-type, and the semiconductor body 104 is n-type.

The n-type semiconductor body 104 may have a cladding layer 116 of Si with a lattice constant smaller than the lattice constant of the n-type semiconductor body 104. The p-type semiconductor body 104 may have no cladding layer, or may have a cladding layer 114 over the p-type semiconductor body 102 that may be formed of SiGe, or may have an intermediate layer of SiGe and an outer Si cladding layer.

Semiconductor device 100 may be formed using non-planar, finFET transistor bodies, such as p-type semiconductor fin 102 and n-type semiconductor fin 104. Semiconductor device 100 may be formed on a bulk crystalline substrate, such as a bulk silicon substrate, or it may be formed on a semiconductor-on-insulator (SOI) substrate. The fins may be arranged in many different orientations on the wafer. Thus, in one form, fins of like carrier charge may be grouped together, or alternatively, fins of different carrier charges may be alternating or paired with one p-type fin adjacent to one n-type fin, as with complementary metal-oxide semiconductor devices (CMOS). Within an integrated circuit, the semiconductor device may be isolated where a pair of p-type and n-type fins have their own gate without any relatively near semiconductor devices in the circuit, or the semiconductor device may be nested within a long line or 2D network of similar, parallel semiconductor devices. It will be understood that while the fins and/or semiconductor bodies are discussed as being p-type or n-type during the initial fabrication steps, this distinction may not actually occur until the well doping, sub-fin doping, gate metals, and/or source and drainage regions of the semiconductor bodies are formed creating different NMOS and PMOS transistors.

The basic transistor elements of the semiconductor device 100 include, as mentioned above, the substrate 106, semiconductor bodies or fins 102 and 104 formed over or on the substrate 106, and that are separated by an insulation layer 118 (also referred to as trench isolation or simply insulation or an isolation). The semiconductor bodies may have a lower portion 108 or 109 and an upper portion 110 or 112. A gate electrode 120 extends over, and transverse to, the semiconductor bodies 102 and 104. Cladding layers 114 and 116 as well as dielectric layers 122 and 124 may be disposed over channel regions 126 and 128 of the semiconductor bodies 102 and 104 and underneath the gate electrode 120. The semiconductor bodies 102 and 104 also may have source regions 130 and 132, and drain regions 134 and 136, shown in dashed line.

The semiconductor device 100 may be an isolated transistor pair where there is one gate electrode between trench isolation along the current flow direction. Otherwise, the semiconductor device 100 may be a portion of an elongated circuit in the fin direction. In other words, in the current flow (or along the fin) direction, nested transistors may be provided where a single fin contains more transistors between the trench isolation.

Referring now to FIG. 7, a method 700 of fabrication is provided for NMOS and PMOS devices without relaxed substrates, and more particularly, for forming semiconductor bodies on a semiconductor device with a crystal lattice of a specific orientation and without a relaxed substrate, all while providing a different cladding structure for p-type and n-type semiconductor bodies, and arranged in accordance with at least some implementations of the present disclosure. In the illustrated implementation, process 700 may include one or more operations, functions or actions as illustrated by one or more of operations 702 to 710 numbered evenly. Implementations herein, however, may include any number of operations such that some of the operations may be skipped or the like. Further, various implementations may include additional operations not shown for the sake of clarity. Also, in general, with the techniques described with respect to FIG. 7, process 700 provides an example method for forming the semiconductor structure of any of the implementations herein; however, other methods may be available for forming such structures.

The process 700 may include an operation to "FORM AT LEAST ONE P-TYPE SEMICONDUCTOR BODY AND AT LEAST ONE N-TYPE SEMICONDUCTOR BODY OVER A SUBSTRATE" 702. By one approach, each semiconductor body has a source region, a channel region, and a drain region, and at least the channel region is formed of a material that comprises SiGe. By the implementations herein, the process proceeds to "FORM A LOWER PORTION OF THE SEMICONDUCTOR BODIES COMPRISING FORMING TRENCHES IN THE SUBSTRATE" 704, which is similar for many of the embodiments herein by forming extensions from the substrate. However, the process to "FORM AN UPPER PORTION OF THE SEMICONDUCTOR BODIES ON THE LOWER PORTIONS AND COMPRISING STRAINED SiGe WITH (110) CRYSTAL ORIENTATION FACING THE CHANNEL FLOW DIRECTION, AND A (110) UPPER FACING SURFACE" 706 may be done differently for different implementations. The following example is one such implementation.

Figure 2:
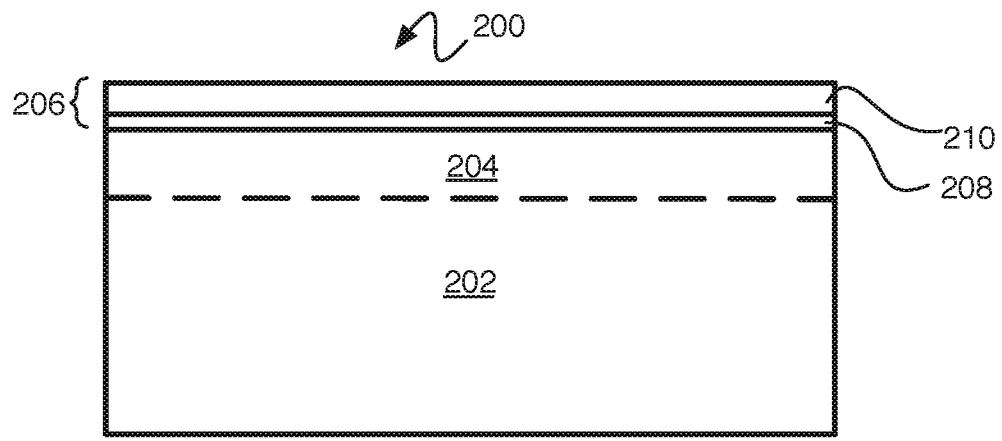
Figure 3:
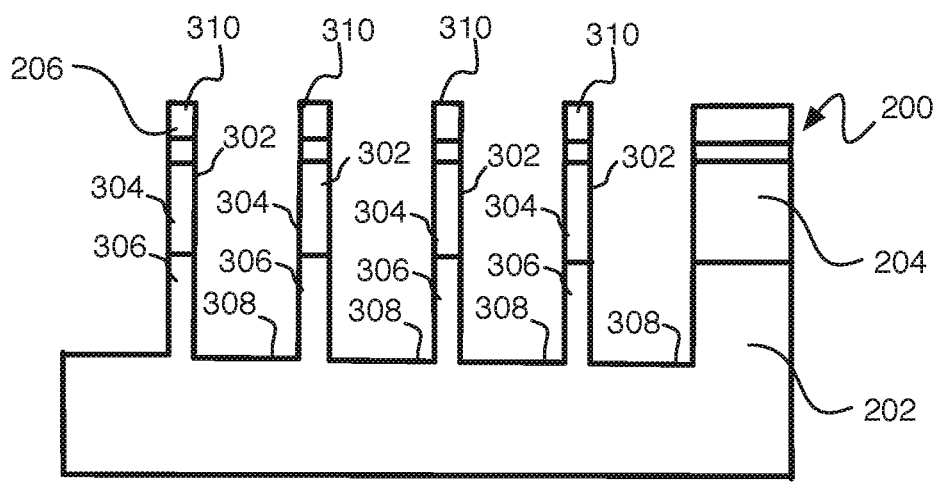
Figure 4:
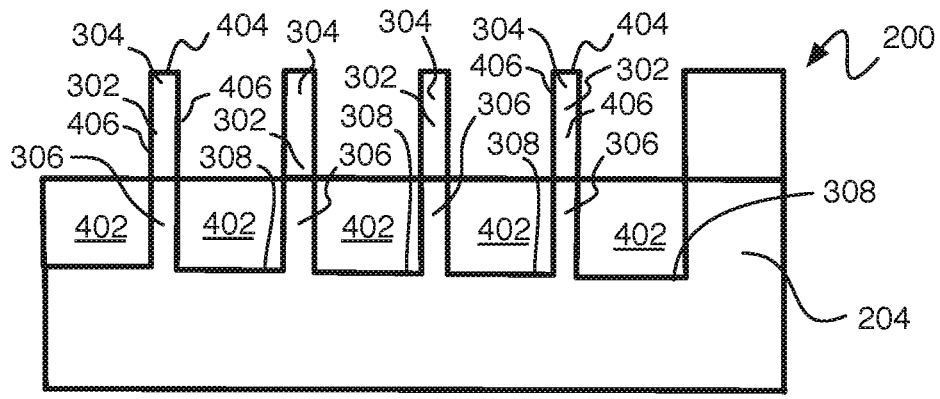
Figure 8:
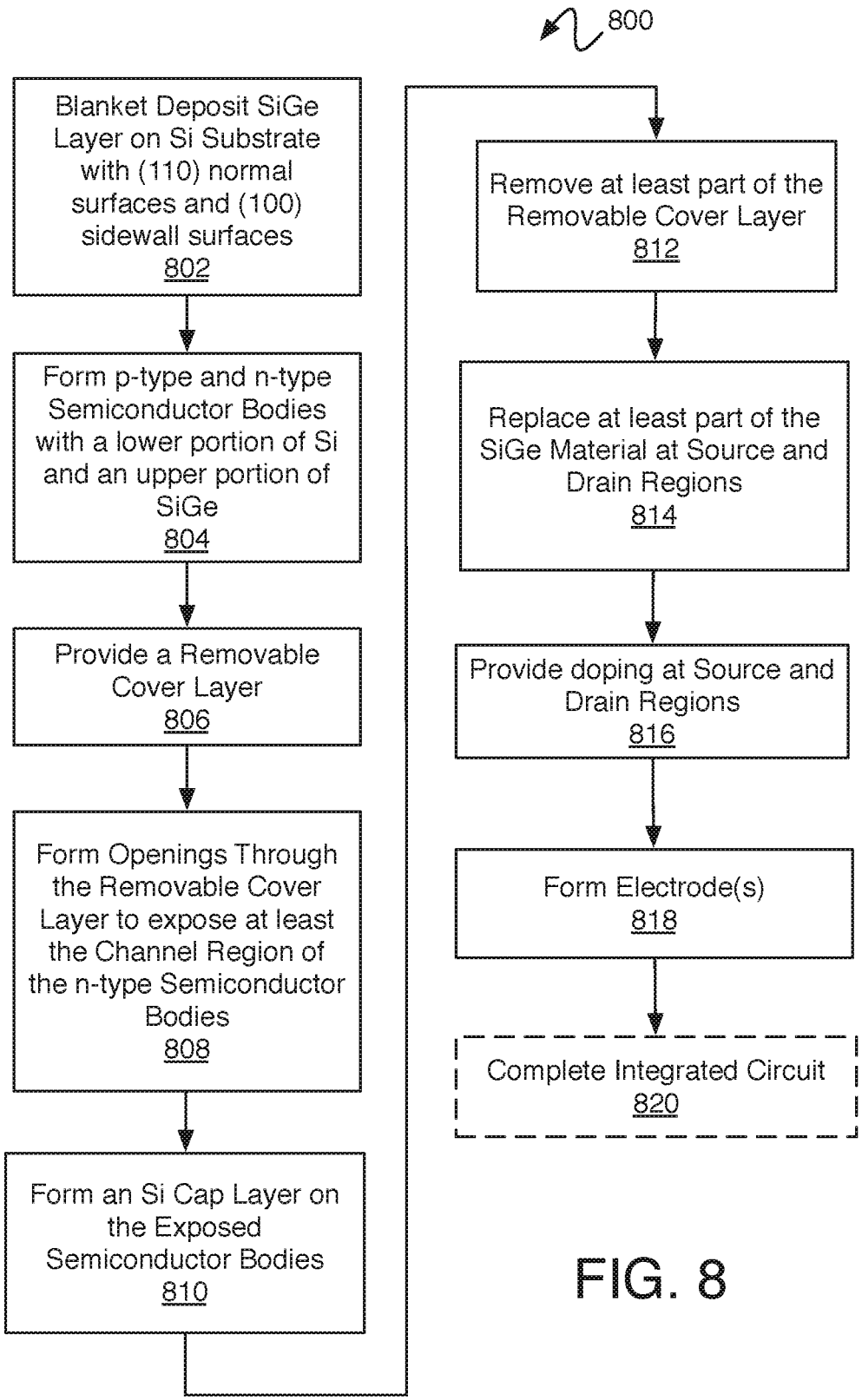
FIG. 8 is a flow chart for fabricating fins of a transistor using a strained layer.

In more detail, and while referring to FIGS. 2-4, a cross-section of semiconductor device 200 is shown in various states during fabrication of the semiconductor bodies, such as for semiconductor device 100. The cross-sections extend along the gate electrode and transverse to the semiconductor bodies (or fins) to provide a section through the channel regions of each of the semiconductor bodies shown. Referring to FIG. 2, in an initial stage, a semiconductor wafer or substrate 202, similar to substrate 106 for instance, may be composed of undoped monocrystalline silicon (Si) in some forms. While the semiconductor substrate 202 here is an intrinsic (for instance, undoped) silicon substrate, in other forms the substrate 202 may be doped to a p type or n type conductivity. The untrenched Si wafer may be about 750 micrometers thick (or tall as in FIG. 2).

Also, the lattice structure of the Si substrate 202 has an upper or top (110) surface, a (110) orientation facing the channel flow direction (or normal surfaces), and will have (100) orientation on sidewalls such that (100) sidewall surfaces will form on the sidewalls of the semiconductor bodies.

By one alternative approach, a layer or film 204 of strained SiGe may be epitaxially grown on the wafer or substrate 202 in a blanket deposition process for example. Strained layer 204 also may be referred to as a strained substrate or substrate layer. The strained layer 204 may be formed of $Si_{(1-x)}Ge_x$ where x is approximately 0.2 to 0.9. In one form, x is 0.3 to 0.7, and in another form $Si_{0.50}Ge_{0.50}$ is used as the material for the strained layer 204. By one form, the blanket strained layer 204 is about Si0.70Ge0.30, and in one form, with at least about 30% Ge. The strained SiGe layer 204 may be epitaxially grown so that the lattice structure of the SiGe layer 204 and the (110) upper surface of the wafer 202 align, and the crystal structure of the SiGe layer 204 conforms to the crystal orientation of the (110) upper surface of the Si Wafer. This forms an upper (110) surface on the SiGe layer and (110) orientation facing the channel flow direction, and once the semiconductor bodies (or fins) are formed, (100) sidewalls on the semiconductor bodies.

It also will be understood that a strained layer refers to an initially strained layer, and specifically refers to the fact that the strained layer conforms to the orientation of the wafer by deposition or other pseudomorphic process for placing the strained layer on the wafer that results in a film with substantially no, or no strain relaxing dislocations. Otherwise, the strained layer may be at least partially relaxed by other methods such as by forming free surfaces on the upper portion of the semiconductor bodies as described below.

By one approach, the initial, un-trenched, strained SiGe layer may be about 250 to 700 Å high, and in one form about 400 to 600 Å high, and in another form 500 Å high to form the upper portion 304 of the semiconductor bodies 102 and 104. The substrate 202 may form the extensions or the lower portion 306 of the semiconductor bodies 302 with a height of 500 to 1300 Å high, to form a total semiconductor or fin height of about 1000 to 2000 Å tall, and in one form approximately 1200 Å, and in another form 1200 Å tall.

Once the strained layer 204 is formed, a mask 206 may be deposited and patterned on the strained layer 204. In some forms, the mask 206 may include a hardmask such as, for example, silicon oxide, and may be an oxidation resistant mask. In one form, the mask 206 may include a lower, thin pad oxide layer 208, such as silicon dioxide, and a thicker, upper layer 210 of a nitride, such as silicon nitride, or other oxidation resistant layer. These layers may be blanket deposited over the strained layer 204. In some approaches, the mask 206 may be a photo-definable material. Photolithography techniques may then be used to mask, expose, and develop a photoresist masking layer over locations where mask portions 310 (shown in FIG. 3) are to be formed. The nitride film 210 and the pad oxide layers 208 are etched in alignment with the formed photoresist mask to form mask portions 310. Mask portions 310 may define active regions in strained layer 204 where semiconductor bodies 302 are to be formed.

Referring to FIG. 3, the exposed portions of strained layer 204 as well as the underlying substrate 202 are etched, such as by an anisotropic etch process, and in alignment with the outside edges of mask portions 310 to form semiconductor bodies or fins 302, and trenches 308 between the semiconductor bodies 302. The trenches 308 are etched to a depth sufficient to isolate adjacent transistors from one another. The etching may occur simultaneously, or may be performed in separate stages where the strained layer 204 is etched first, and then the substrate 202 is etched. This will form the semiconductor bodies 302 with a strained upper portion 304 of SiGe, and a Si lower portion 306 that extends from the substrate 202 as shown in FIG. 3.

An insulation or isolation layer 402 (FIG. 4) is deposited in the trenches 308 to form shallow trench isolation STI regions, and may be formed of a dielectric or electrically insulative material. The electrically insulative material may include any suitable material for shallow trench isolation (STI). In some forms, the electrically insulative material for the insulation layer 402 may include dielectric materials known for their applicability in integrated circuit structures, such as low-k dielectric materials. Examples of dielectric materials that may be used for insulation layer 402 include, but are not limited to, silicon oxide, silicon dioxide, carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass.

By one approach, the insulation layer 402 may be formed by first growing a thin liner oxide in the bottom of the trenches 308. Next, trenches 308 are filled by blanket depositing an oxide dielectric layer over the liner oxide by, for example, a high density plasma (HDP) chemical vapor deposition process. This blanket deposition leaves the insulation layer 402 within the trenches 308 and on mask portions 310. The portions of the insulation layer 402 on the mask portions 310, and the mask portions 310 themselves, may be removed using chemical mechanical polishing creating a flat surface of the top of semiconductor bodies 302 and the insulation material. The insulation material within the trenches 308 then may be etched to a certain depth using either wet or dry etching techniques, and in one form to the same height as the lower portions 306. This leaves the structure with insulation layer 402, similar to insulation layer 118, in the bottom of the trenches 308 while exposing the top 404 and sides 406 of the strained upper portion 304 of the semiconductor bodies 302, as shown on FIG. 4. The process then continues with FIGS. 5-8 for forming the cladding layers.

By a different approach for forming the upper portions of the semiconductor bodies (operation 706 of FIG. 7), the entire height of the semiconductor bodies 302 is initially formed as an extension from the substrate 202, and the blanket deposited, strained layer 204 is omitted. In this example case, the process would be similar to that explained with FIGS. 2-4 except that there is no separation line yet between lower and upper portions along the height of the semiconductor body 302. For this example, a silicon semiconductor body is provided from the extensions from the substrate 202, and subsequently, SiGe is oxidized or diffused into an upper portion of the semiconductor body 302 to create the different lower and upper portions of the semiconductor body. This method is explained below with reference to FIGS. 12-15 and method 1600 of FIG. 16.

Returning to the present example where the upper portion of the semiconductor bodies 302 are formed by blanket deposition of SiGe, FIGS. 5-6 show the semiconductor device 200 in various states for the fabrication of the cladding layers. The process to "FORM A CLADDING LAYER ON AT LEAST ONE OF THE N-TYPE SEMICONDUCTOR BODIES" 708 is explained in more detail with a method 800 of FIG. 8.

Method 800 is provided for forming cladding layers on at least initially strained SiGe portions of n-type and p-type semiconductor bodies. In the illustrated implementation, process 800 may include one or more operations, functions or actions as illustrated by one or more of operations 802 to 820 numbered evenly. Implementations herein, however, may include any number of operations such that some of the operations may be skipped or the like. Further, various implementations may include additional operations not shown for the sake of clarity. Also, in general, with the techniques described with respect to FIG. 8, process 800 provides an example method for forming the cladding semiconductor structure of the implementations of FIGS. 2-6 herein; however, other methods may be available for forming such structures.

Thus, process 800 may be used with a "blanket deposit of a SiGe layer on a Si substrate with (110) normal surfaces and (100) sidewall surfaces" 802 that is used to "form the "p-type and n-type semiconductor bodies with a lower portion of Si and an upper portion of SiGe" 804 as already explained above with semiconductor device 200 on FIGS. 2-4.

Referring to FIG. 5, once a p-type metal oxide semiconductor (PMOS) body or fin 502 extends upward from insulation layers 402, and an n-type metal oxide semiconductor (NMOS) body or fin 504 extends upward from insulation layers 402, the process may proceed with forming the cladding layers. It will be understood, as mentioned above, the p-type and n-type semiconductor bodies may or may not be located directly adjacent to each other such that both the n-type and p-type semiconductor bodies 502 and 504 contact the same insulation layer or layer portion 402 disposed between the two semiconductor bodies.

The process 800 may continue with an operation to "provide a removable cover layer" 806, and by one example, to first cover at least the p-type semiconductor body or bodies 502 to place a first, or only, cladding layer on the n-type semiconductor body or bodies 504. In another form, this operation may include blanket depositing a removable cover layer over both p-type and n-type semiconductor bodies 502 and 504. As shown in FIG. 5, a cover layer 506, also referred to as a mask, may be blanket deposited by chemical vapor deposition (CVD), and in one form low temperature CVD, or atomic layer deposition (ALD), over the wafer. Such a cover may be made of an oxide or nitride such as silicon dioxide or silicon nitride.

The cover layer 506 then may be patterned using photolithography to "form openings through the removable cover layer to expose at least the channel region of the n-type semiconductor bodies" 808, such as opening 508 on FIG. 5 formed to expose the n-type semiconductor bodies 504. Selective epitaxial growth or other similar deposition processes may be used to "form a Si cap layer on the exposed semiconductor bodies" 810. In the illustrated example, the p-type semiconductor body 502 remains covered while the cap or cladding layer 602 is grown on the exposed n-type semiconductor body 504. The cladding layer 602 may be grown to cover the sidewalls 406 and top surface 404 (as indicated in FIG. 4) of the semiconductor body 504. The cladding layer may be a thickness of 5 to 40 Å, and in one example approximately 15, or approximately 20 Å, or 20 Å, when placed upon an upper portion 510 of the semiconductor body 504 that is 20 to 120 Å wide.

The cladding layer 602 on the n-type semiconductor bodies, by one example, may be formed of Si. The difference between the lattice dimensions of Si and the SiGe in the semiconductor body causes a tensile stress and a strain in both the cladding layer and the semiconductor body, and in the channel flow direction. The cladding layer 602 has a silicon crystal lattice constant that is smaller than that of the vertical lattice constant of the strained SiGe semiconductor body 504. This results in a vertical tensile strain in the cladding layer. The cladding layer 602 may be selectively epitaxially grown on the non-relaxed SiGe semiconductor body 504 for this purpose and as explained above.

The epitaxial growth also causes the crystal lattice of the cladding layer 602 to match the orientation of the lattice of the semiconductor body 502 providing a (110) channel direction (where the 110 face of the lattice is facing the current flow direction), the sidewalls of the cladding layer with (100) surfaces, and a (110) upper, facing surface.

Once the cladding layer 602 is formed, an operation may be performed to "remove at least part of the removable cover layer" 812 as well as any excess cladding material on the cover layer. The cover layer 506 may be removed by dry or wet etching for example, resulting in the uncovered structure without a cladding layer over the p-type semiconductor body 502 as shown in FIG. 6.

In an alternative process, the material for the Si cladding layer may be blanket deposited over both the n-type and p-type semiconductor devices without providing a cover. In this case, the undesired Si cladding layer on the p-type semiconductor bodies 502 may be etched off. Otherwise, the Si cladding layer may be kept on the p-type semiconductor bodies 502, with the transport in the strained SiGe layer. By yet other alternatives, once the p-type semiconductor bodies 502 are clean, an operation may be provided to "form a cladding layer on at least one of the p-type semiconductor bodies" 710, and may have a different material than that on the n-type semiconductor bodies. In one form, such a cladding may be Ge or a SiGe material with a fraction of Ge different than that of the SiGe semiconductor body so that a strain is also created by the lattice difference between cladding layer and core or semiconductor body 502. By one example, when the semiconductor body is Si0.50Ge0.50, the cladding layer may be formed of Ge. This may be accomplished by using the cover process mentioned above to now cover the cladded n-type semiconductor bodies and expose the p-type semiconductor bodies for selective deposition of the second cladding layer on the p-type semiconductor bodies.

If the p-type semiconductor bodies 502 are not to receive their own cladding layers, or once such the cladding layers are in place, the process 800 may continue from here to provide the source and drain regions. By one approach, this may include an operation to "replace at least part of the SiGe material at source and drain regions" 814, and by one example with Si for NMOS devices and Ge (or SiGe with a greater percentage of Ge compared to that in at the channel region) for the PMOS devices.

Figure 9:
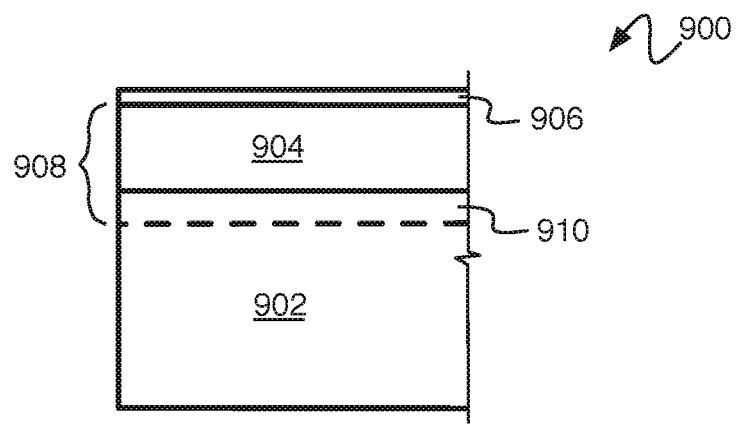
FIGS. 9-11 are cross-sectional views of other example transistors as particular fabrication operations are performed.
Figure 10:
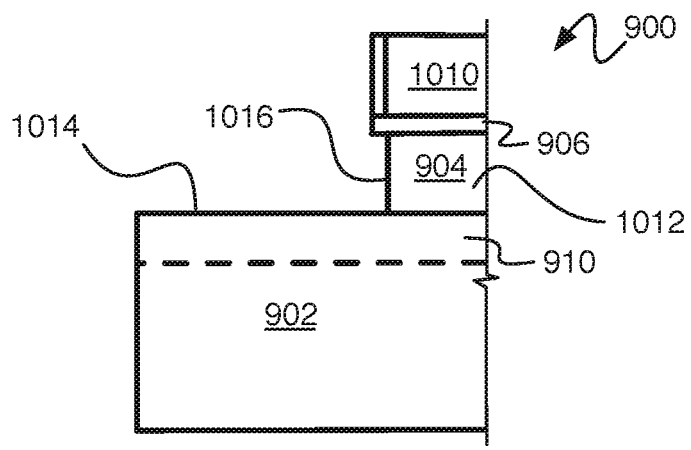
Figure 11:
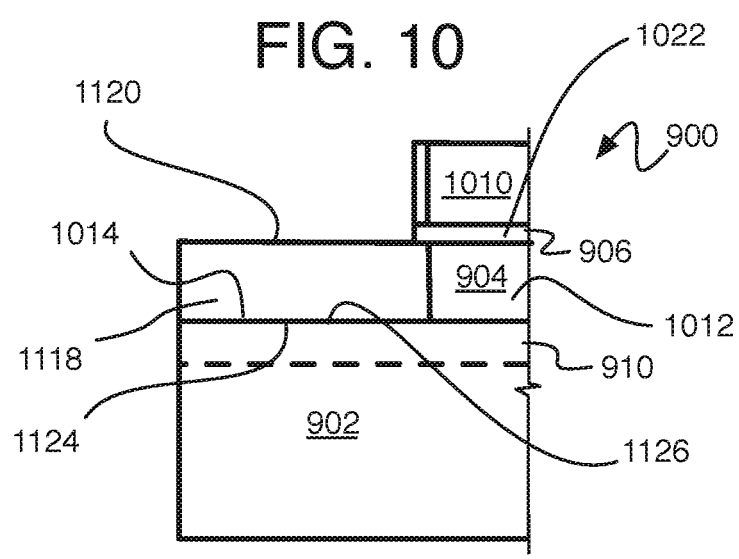

Referring to FIGS. 9-11, the source and drain regions may be formed by providing a doped Si source/drain region for n-type semiconductor bodies, and in one alternative, doped SiGe or Ge source/drain region for the p-type semiconductor bodies, and further in one form, where a higher percentage of Ge is provided than that in the channel region of the same semiconductor body. Thus, in one example form, the materials of the drain and source regions are the same or similar to that of the cladding layers on the same semiconductor body. This may be provided for both the n-type and p-type semiconductor bodies. By other alternatives, the source and drain regions may be different materials with different elements.

The source and drain regions may be formed by etching out the cladding 906 and semiconductor body layers 904 in regions adjacent to a gate stack 1010 using either wet or dry etching and epitaxially growing in doped Si or SiGe/Ge to form the source and drain regions. The etch process may include an etch under-cut (EUC) technique. When the cladding layer 906 and semiconductor body 904 are etched, a free surface, such as a free surface 1016 (FIG. 10) is formed that may cause at least some elastic relaxation of the SiGe upper portion at the channel region. For the n-type semiconductor bodies this causes an increase in the strain at the Si cladding layer. Once the Si is deposited in the source and drain regions, the amount of strain will depend, at least in part, on the condition of the edge defects of the Si source and drain regions.

After the etch process, a source or drain layer 1116 may be deposited on the semiconductor body 910 to form the source and drain regions 1116. The deposition process may be an epitaxial silicon or silicon germanium process. The source or drain layer 1116 may similarly correspond to any of the source or drain regions mentioned herein such as source regions 130 and 132, and drain regions 134 and 136 of FIG. 1. It also will be understood that the drain or source region 1116 may be grown to have the same or similar or otherwise corresponding cross-sectional dimensions of the strained SiGe semiconductor body to maintain a continuous fin by one example. By one form, the top surface 1120 of the source or drain layer 1116 may be at the same height as the top 1022 of the semiconductor body 904 at the channel region 1012. The bottom surface 1124 of the source or drain layer 1116 may be on or at the top of the lower portion 910 of the semiconductor body 908 and that aligns with the top surface of 144 of the insulation layers 118 as shown in FIG. 1. Otherwise, the source and drain layers may have different dimensions or shapes, such as a curved bottom surface by one example, or a bottom that is lower than the top of the insulation layer 402 but, in at least one form, higher than the bottom of the trench 308 (FIG. 4).

By an alternative, instead of etching the SiGe layer 904 and epitaxially growing new source and drain regions, the strained SiGe layer 904 may be maintained and doped to form source and drain regions. By either method, the process 800 may proceed with an operation to "provide doping at source and drain regions" 816. The regions may be doped using implantation and annealing or indiffusion from a solid source. The source and drain regions may be doped appropriately based on whether the transistor is a p-type or n-type. By one approach, the source/drain regions have a doping concentration of between approximately $1 \times 10^{19}$ to $1 \times 10^{21}$ atoms/cm$^3$, and in one form, at least approximately $5 \times 10^{20}$ atoms/cm$^3$. The atoms used to dope the source and drain regions are well known in the art, such as the use of boron or aluminum for p-type transistors and the use of phosphorous or arsenic for n-type transistors. The source/drain regions can be formed of uniform concentration or can include sub-regions of different concentrations or doping profiles, such as tip regions (for example, source/drain extensions). In one form, when transistor 900 is a symmetrical transistor, the source and drain regions will have the same doping concentration profile. In another form, transistor 900 is an asymmetrical transistor, and the source region and drain region may have varied doping in order to obtain particular electrical characteristics.

The process 800 may continue with an operation to "form electrodes" 818. Thus, a gate 1010 (FIGS. 10-11) may also be formed and may include a gate dielectric such as gate dielectric 122 or 124 (FIG. 1) and a gate electrode 120 (FIG. 1). This may include forming the gate dielectric layer 122 or 124 over the cladding layers 114, if it exists, or 116 respectively, and at the channel regions 1012 of the semiconductor bodies 904. Such a dielectric layer may be a grown gate dielectric layer, such as but not limited to a silicon dioxide layer, a silicon oxynitride layer or a combination thereof. A silicon oxide or silicon oxynitride layer can be grown on cladding layers 906, similar to cladding layer 602 (FIG. 6), or 114 or 116 (FIG. 1) using dry/wet oxidation processes. When the gate dielectric layer 122 or 124 is grown, in one example, it may be formed selectively only on semiconductor containing areas, such as the cladding layers 114 and 116 (FIG. 1) or cladding layer 602, and not on isolation or insulation regions 402 or 118. Alternatively, gate dielectric layers 122 and 124 can be a blanket deposited dielectric layer. The gate dielectric layer 122 or 124 may be a high-K gate dielectric layer, including a metal oxide dielectric layer, such as but not limited to hafnium oxide, zirconium oxide, tantalum oxide and titanium oxide, hafnium silicon oxide, lanthanum oxide, lanthanum aluminum oxide, zirconium silicon oxide, barium strontium titanium oxide, barium titanium oxide, strontium titanium oxide, yttrium oxide, aluminum oxide, lead scandium tantalum oxide, and lead zinc niobate, to name a few examples. A high-k metal oxide dielectric layer can be deposited by chemical vapor deposition or sputter deposition, and so forth. In some forms, an annealing process may be carried out on the gate dielectric 122 or 124 to improve its quality when a high-k material is used. In some forms, the gate dielectric 122 or 124 may include a dummy oxide that is subsequently removed in a process flow together with a dummy gate electrode and replaced with a high-k gate dielectric and metal gate. By one example, when gate dielectric layers 122 and 124 are deposited, it may have ends that form on isolation regions 402/118.

The gate electrode 120 may be formed on the gate dielectric 122 and 124, and may be composed of at least one p-type workfunction metal or n-type workfunction metal, depending on whether the transistor is to be a PMOS (for example, p-type) or an NMOS (for example, n-type) transistor. In some implementations, the gate electrode 120 may comprise of two or more metal films or layers, where at least one metal layer is a workfunction metal layer and at least one metal layer is a fill metal layer. In some forms, the gate electrode 120 may be a polysilicon gate electrode. In other implementations as mentioned above, the gate electrode 120 may be a dummy polysilicon gate electrode that is subsequently removed in a process flow and replaced with a metal gate electrode. By one form, gate electrode 120 is formed to a thickness sufficient to completely cover or surround the channel regions of the semiconductor bodies 102 and 104, cladding layers 114 and 116, and gate dielectric layers 122 and 124 as shown in FIG. 1.

For a PMOS transistor, metals that may be used for the gate electrode 120 include, but are not limited to, ruthenium, palladium, platinum, cobalt, nickel, and conductive metal oxides, for example, ruthenium oxide. For an NMOS transistor, metals that may be used for the gate electrode 120 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. Other materials for the gate electrode may include titanium or tantalum nitrides as well.

The gate electrode may be formed by blanket deposit of the electrode material over insulation layers 118 so that it deposits onto and around gate dielectric layer 122 and 124. That is, the gate electrode material is deposited onto the gate dielectric layer 122 and 124 formed on the cladding layers 114, if present, and 116 formed on the top surface 142 and sidewalls 138 and 140 of semiconductor bodies 102 and 104. Gate electrode material and gate dielectric layer, if not done so already, can be patterned utilizing photolithography and etching techniques. Although, a subtractive process is mentioned, other techniques, such as a replacement gate process may be utilized to form gate electrode 120.

In some forms, a pair of spacers (not shown) may bracket the gate electrode 120, for example, on opposing surfaces of the gate electrode 120. The spacers may be formed from a material such as silicon nitride, silicon oxide, silicon carbide, silicon nitride doped with carbon, and silicon oxynitride. Processes for forming spacers may generally include deposition and etching processes and/or other well-known techniques.

The process 800 also optionally includes "complete integrated circuit" 820 when the semiconductor device 100 or 200, for example, is one of many such devices for an integrated circuit rather than as an isolated transistor. In this case, "back end" techniques can be utilized to form metal contacts, metallization layers and interlayer dielectrics to interconnect various transistors together into functional integrated circuits, such as microprocessors.

Referring to FIGS. 12-16, an alternative process 1600 is provided for forming the initially strained SiGe upper portion of the semiconductor bodies using diffusion or oxidation and for providing cladding layers on the upper portions, enabling cladding for both n and p transistors. Thus, process 1600 provides a different process to perform operations 706, 708, and 710 of process 700, and is an alternative to process 800. In the illustrated implementation, process 1600 may include one or more operations, functions, or actions as illustrated by one or more of operations 1602 to 1620 numbered evenly. Implementations herein, however, may include any number of operations such that some of the operations may be skipped or the like. Further, various implementations may include additional operations not shown for the sake of clarity. Also, in general, with the techniques described with respect to FIG. 16, process 1600 provides an example method for forming the cladding semiconductor structure of the implementations of FIGS. 12-15 herein; however, other methods may be available for forming such structures.

Referring to FIG. 12, process 1600 may include an operation to "form p-type and n-type semiconductor bodies from the Si substrate" 1602, and particularly so that initially, the entire height of the semiconductor body 1202 and 1204 is made of Si. The semiconductor bodies 1202 and 1204 may be formed by a similar etching process, as well as the insulation deposition operation, as mentioned above, and to deposit insulation 1206 here, except that in this case the cores of the upper portions of the semiconductor bodies are not formed from blanket deposition of a strained SiGe layer on the flat top surface of the non-trenched Si substrate or wafer.

Instead, the process 1600 continues to "form SiGe layer over the semiconductor bodies" 1604. This may be performed using selective epitaxial deposition or blanket deposition with the areas between the semiconductor bodies 1202 and 1204 etched away, or removed by using photolithography or other methods. The SiGe layer may be deposited initially at a thickness of approximately 1-4 nm. As shown in FIG. 12, this results in a Si inner region or core and outer, initial cap or cladding layer 1208 or 1210 of SiGe on the semiconductor bodies 1202 and 1204.

Referring to FIG. 13, the process 1600 may continue with "provide a removable cover layer over p-type semiconductor bodies" 1606. Such a cover 1302 may be a nitride such as silicon nitride or other materials sufficient to prevent oxidation of the SiGe layer 1208 into the p-type Si semiconductor body 1202. As with cover 506 (FIG. 5), the cover 1302 may be blanket deposited by chemical vapor deposition (CVD), and in one form low temperature CVD, or atomic layer deposition (ALD) over the wafer and semiconductor devices. In one form, the cover layer 1302 then may be patterned using photolithography to form openings through the removable cover layer to expose at least the channel region of the n-type semiconductor bodies.

Once the p-type semiconductor bodies 1202 are covered, the upper portions of the n-type Si semiconductor bodies 1204 are either partially or wholly transformed into SiGe upper portions 1304. This may be performed in two distinct oxidation and/or diffusion phases. The first phase is used to "transform a part of the Si n-type semiconductor bodies into SiGe" 1608. This may be accomplished by using oxidation such as rapid thermal oxidation (RTO) or other annealing process that diffuses the Ge from the SiGe layer 1210 into the Si semiconductor body 1204, and removes Si from the fin to form silicon oxide. For example, about 700-1000° C. for about 10 to about 300 seconds in RTO can be used. This procedure transforms the initial SiGe cladding layer 1210 and at least outer areas of an upper portion 1304 of the initially Si n-type semiconductor bodies 1204 into a condensed, strained SiGe. In one instance, the inner region 1310 of the upper portion 1304 is substantially or totally consumed in the first phase, and the entire upper portion of the NMOS fin will be strained SiGe as in FIG. 14. In this case, the second phase described below is skipped. By another example, as shown in FIG. 13, in an intermediate stage, an outer, strained SiGe layer 1308 is formed over an inner region 1310 that remains Si for now. In other words, the first oxidation and/or diffusion phase in the process may or may not completely replace the Si with SiGe at the upper portion 1304 of the semiconductor bodies 1202. The Si inner region in the upper portion 1304 also may become narrower than the lower portion 1306 of the n-type semiconductor bodies 1204 (FIG. 13).

Referring to FIG. 14, the process 1600 may then include an operation to "remove the cover layer" 1610 by dry or wet etching for example, and to expose the p-type Si semiconductor bodies 1202 and the initial SiGe cladding layer 1208 for the next phase of oxidation or annealing. Once uncovered, the process 1600 may include an operation to "transform a part of the Si n-type semiconductor bodies into SiGe while transforming a part of the p-type semiconductor bodies into SiGe" 1612. Thus, for this second phase RTO or other annealing procedures may be applied, and in one form, about 700-1000° C. for about 10× about 300 seconds in RTO. The resulting structure may provide n-type semiconductor bodies 1204 with a narrower strained SiGe upper portion 1402 while the outer layer has been mostly or fully consumed so that no cover may exist at this point for the SiGe upper portion 1402. The p-type semiconductor bodies 1202 now have a narrower upper portion 1404 forming a Si inner region or core covered by a SiGe cap or cladding layer 1408 formed from the initial cladding layer 1208. In an alternative instance, as mentioned above, no second condensation step may be needed. In this case, the PMOS SiGe, strained cladding layer 1208 remains as a cladding layer on the PMOS device 1202. This PMOS cladding layer then may be maintained or removed. Either way, further cladding layers may be deposited as explained below.

Referring to FIG. 15, the process 1600 may continue with "provide a Si cap layer on the n-type semiconductor bodies" 1614 to provide a strained cladding or cap layer 1502 over the SiGe upper portion 1402 of the n-type semiconductor bodies. This may be provided by selective epitaxial deposition or blanket deposition. When blanket deposition is used, the undesired cladding layer may be etched off of the p-type semiconductor bodies 1202 or otherwise, a cover or mask may be used and then removed as described above for other implementations herein.

Alternatively, the blanket deposition may be used when a Si cladding layer 1504 is desired as shown in dashed line on FIG. 15. Thus, the process 1600 may include "provide a Si cap layer on the p-type semiconductor bodies" 1616. Such Si cladding layers may be the same or different thicknesses. Such Si cladding layers in the n-type and p-type bodies may have a thickness 0.5-2.5 nm. The resulting three-layer structure for the upper portion 1404 of the p-type semiconductor bodies 1202 includes the Si inner region or core 1410, an intermediate or middle SiGe layer 1408 over the inner region 1410 (or SiGe layer 1208 when no second phase is performed), and optionally, an outer Si cladding layer 1504 over the SiGe layer 1408. The three layer, or two layers if the outer Si cladding layer 1504 is not present, are strained in the channel flow direction due to the mismatch in crystal lattice size as explained above. The SiGe cladding layers will be compressively strained (both vertically and along the current flow direction) to the Si core which will improve hole mobility. The Si cladding layer for NMOS will be vertically tensile strained because it matches the large vertical lattice constant of the SiGe core which improves electron mobility in the cladding.

The Si capping layer 1504 for the PMOS may be used to improve the gate dielectrics. In this case, the Si capping layer 1504 may be about 0.5-1 nm in thickness so that all or most of the carrier transport is in the strained SiGe/Ge cladding layers. Otherwise, other options for capping layers may exist so that outer cladding layers 1504 may be made of different materials, such as Ge or SiGe with a different fraction of Ge, and may be formed on the p-type semiconductor bodies instead of the Si outer cladding layer in order to increase hole mobility. For any of the cases mentioned above, the final cladding layer may be a cladding layer that is about 30-100% Ge for the PMOS device and the core of the NMOS device may be about 30-70% Ge in the SiGe for the NMOS device.

The process 1600 may continue with "form source and drain regions, and electrodes" 1618, and "complete integrated circuit" 1620 as already explained above for process 800.

While implementation of example process 700, 800, and 1600, may include the undertaking of all operations shown in the order illustrated, the present disclosure is not limited in this regard and, in various examples, implementation of processes 700 and 800 may include the undertaking only a subset of the operations shown and/or in a different order than illustrated.

Figure 16:
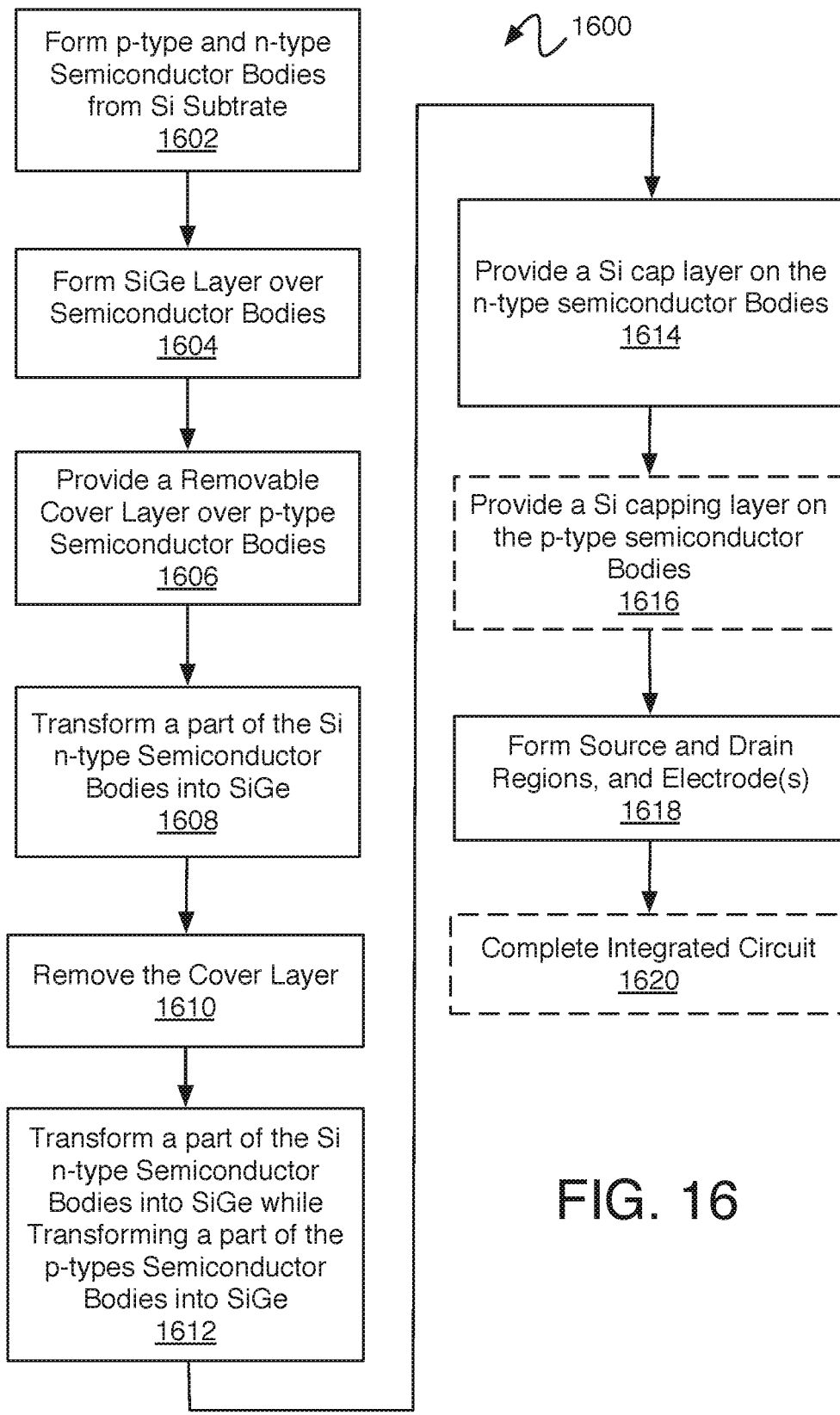
FIG. 16 is a flow chart for fabricating fins of a transistor using diffusion.

In addition, any one or more of the operations of FIG. 7, 9, or 16 may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the operations shown in FIGS. 7, 9 and/or 16 in response to instructions conveyed to the processor by a computer readable medium.

Referring to FIGS. 17-22, a sample of the data for simulations performed for cladded devices as described herein. An example NMOS device is provided for comparison between (100) and (110) wafers as well as isolated and nested devices. As mentioned above, isolated devices have the fins along the same line separated by the insulation layer, each with its own gate electrode, where such cutoff for insulation forms an extra free surface. A further benefit of this cladding structure is that the stress and improved mobility is improved for isolated devices due to the elastic relaxation of the strained SiGe layer causing tensile strain in the Si cladding along the current flow direction.

The semiconductor body here had a 2 nm wide Si cladding layer over an 8 nm wide SiGe inner region with Si70Ge30. The devices simulated here did not use the Si source and drain option described above and maintained the same semiconductor body material over the source and drain regions, but was otherwise appropriately doped as described above. The simulation is for the stress post Si cladding and are for ¼ of the device, so the middle of the channel will be on the right of each structure.

FIGS. 17-20 show that vertical stress does not significantly change from isolated to nested (110) wafer devices, but that the current flow stress for the isolated device with (110) wafer has a significantly greater stress than the nested (which has 0.0). FIG. 21 shows that the isolated (110) wafer device has a higher mobility than the nested (110) wafer device, and both the isolated and nested (100) wafer devices. FIG. 22 shows that the Si occupancy for core widths of about 4-8 nm for isolated (110) wafer devices is greater than the other three devices. Mobility for 100 sidewalls without stress are expected to be about 250 cm2/Vs.

Figure 23:
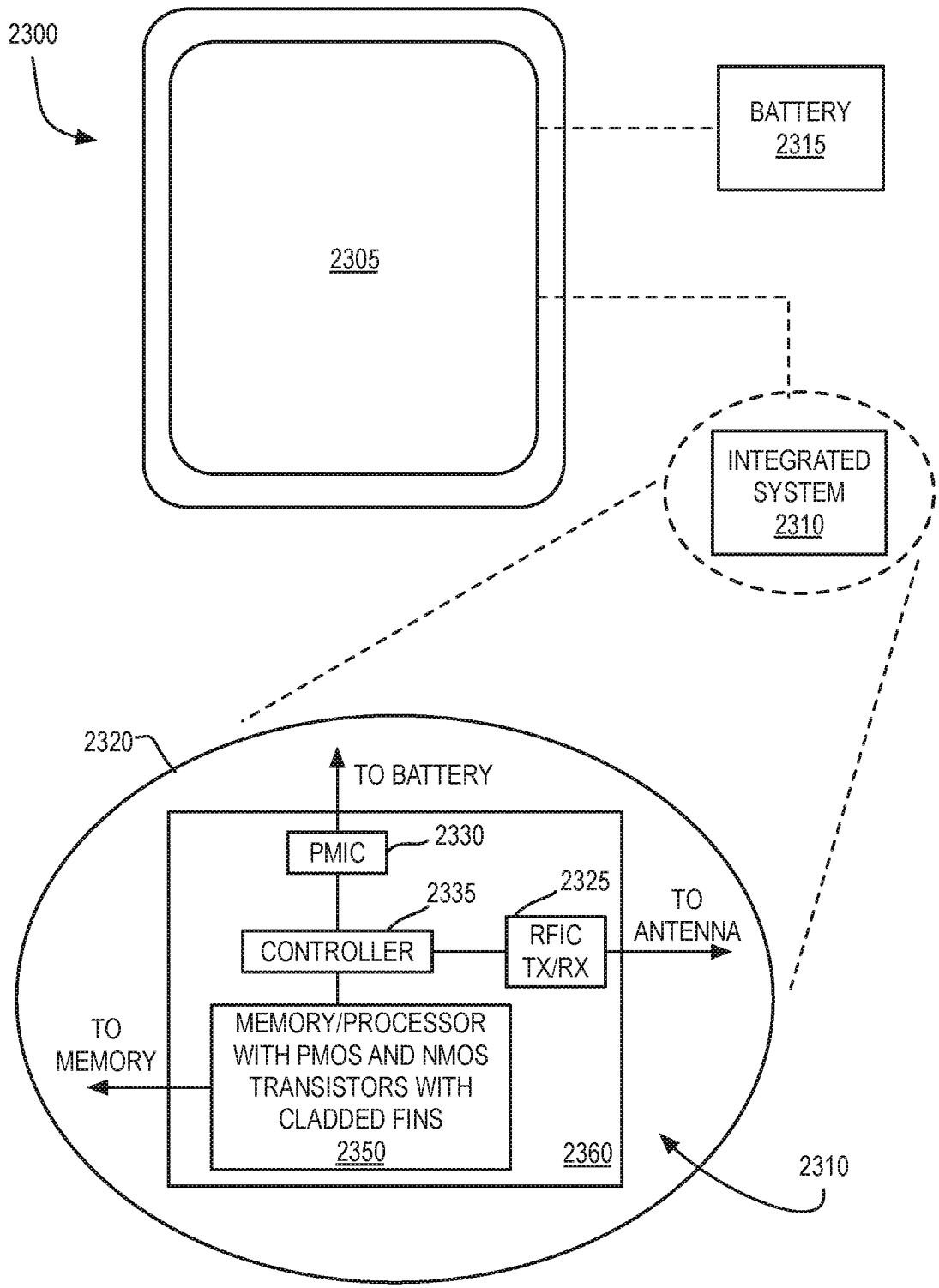
FIG. 23 is an illustrative diagram of a mobile computing platform employing an integrated circuit with transistors having a cladding layer on fins of the transistor.

FIG. 23 is an illustrative diagram of a mobile computing platform employing an IC with transistors having an unrecessed field insulator and thinner electrodes over the field insulator, arranged in accordance with at least some implementations of the present disclosure. Mobile computing platform 2300 may be any portable device configured for each of electronic data display, electronic data processing, wireless electronic data transmission, or the like. For example, mobile computing platform 2300 may be any of a tablet, a smart phone, laptop computer, etc. and may include a display screen 2305, which in the exemplary implementation is a touchscreen (for example, capacitive, inductive, resistive, etc. touchscreen), a chip-level (SoC) or package-level integrated system 2310, and a battery 2315.

Integrated system 2310 is further illustrated in the expanded view 2320. In the exemplary implementation, packaged device 2350 (labeled "Memory/Processor with Transistors with PMOS and NMOS transistors with Cladded Fins" in FIG. 23, and according to the implementations described herein) includes at least one memory chip (for example, RAM), and/or at least one processor chip (for example, a microprocessor, a multi-core microprocessor, or graphics processor, or the like) employing transistors with p-type and n-type cladded fins as discussed herein. In an implementation, the package device 2350 is a microprocessor including an SRAM cache memory employing transistors with p-type and n-type cladded fins as discussed herein (for example, the SRAM cache memory may include an inverter circuit employing transistors as discussed herein).

An employed transistor may include a semiconductor device with a substrate, a strained layer forming both p-type and n-type semiconductor bodies such as fins, and cladding layers over or on at least the n-type semiconductor bodies, where the cladding layers are grown as described herein. Packaged device 2350 may be further coupled to (for example, communicatively coupled to) a board, a substrate, or an interposer 2360 along with, one or more of a power management integrated circuit (PMIC) 2330, RF (wireless) integrated circuit (RFIC) 2325 including a wideband RF (wireless) transmitter and/or receiver (TX/RX) (for example, including a digital baseband and an analog front end module further comprises a power amplifier on a transmit path and a low noise amplifier on a receive path), and a controller thereof 2335. In general, packaged device

2350 may be also be coupled to (for example, communicatively coupled to) display screen 2305.

Functionally, PMIC 2330 may perform battery power regulation, DC-to-DC conversion, etc., and so has an input coupled to battery 2315 and with an output providing a current supply to other functional modules. As further illustrated, in the exemplary implementation, RFIC 2325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 2350 or within a single IC (SoC) coupled to the package substrate of the packaged device 2350.

Figure 24:
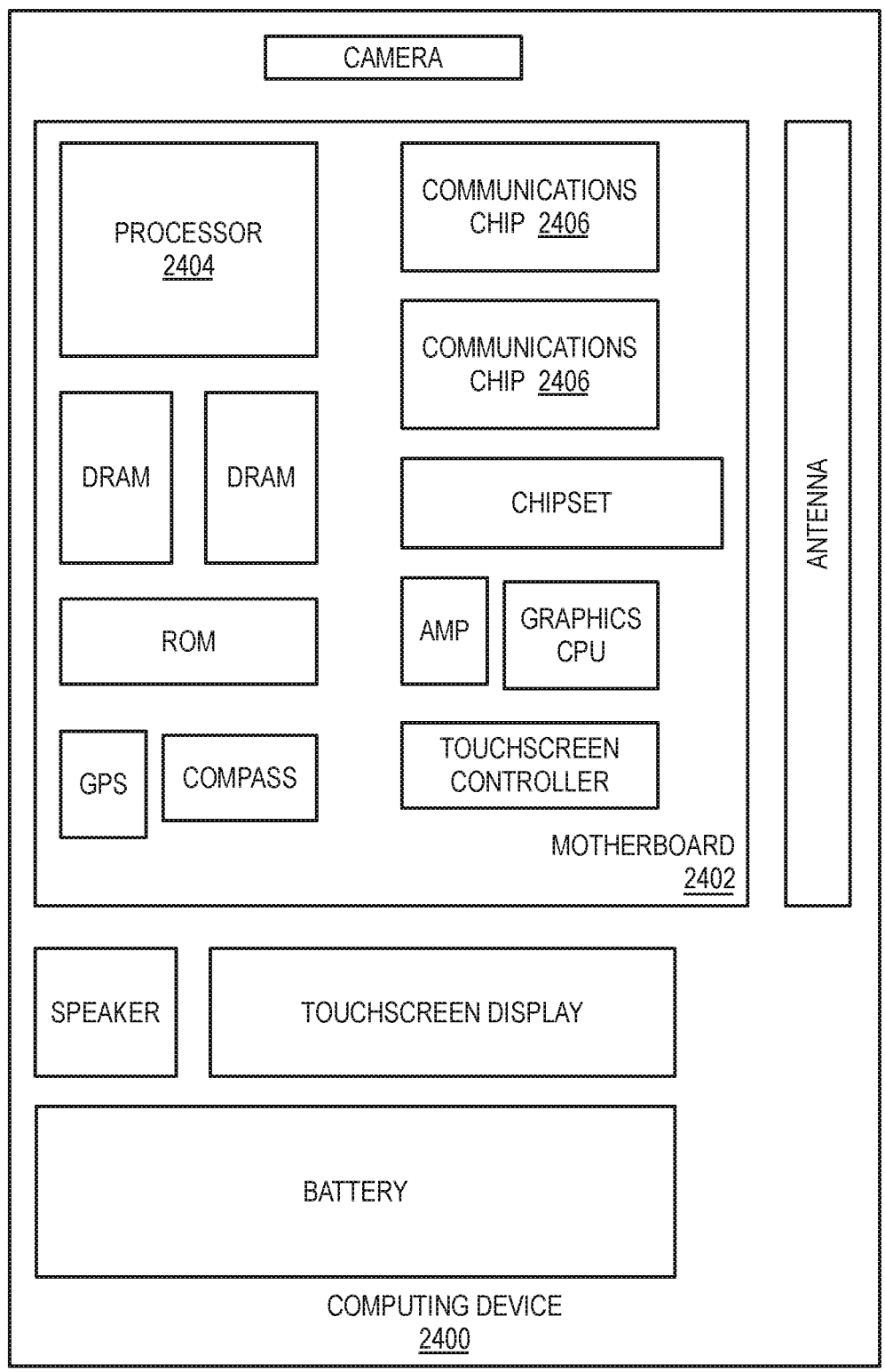
FIG. 24 is a functional block diagram of a computing device, all arranged in accordance with at least some implementations of the present disclosure

FIG. 24 is a functional block diagram of a computing device 2400, arranged in accordance with at least some implementations of the present disclosure. Computing device 2400 may be found inside platform 23 s 00, for example, and further includes a motherboard 2402 hosting a number of components, such as but not limited to a processor 2404 (for example, an applications processor), which may incorporate transistors with cladded p-type and n-type semiconductor bodies as discussed herein, and at least one communication chip 2406. In implementations, at least one of the processor 2404, one or more communication chips 2406, or the like may be physically and/or electrically coupled to motherboard 2402. In some examples, processor 2404 includes an integrated circuit die packaged within the processor 2404. In general, the term "processor" may refer to any device or portion of a device that processes electronic data from registers and/or memory to transform that electronic data into other electronic data that may be stored in registers and/or memory.

In various examples, one or more communication chips 2406 may also be physically and/or electrically coupled to the motherboard 2402. In further implementations, communication chips 2406 may be part of processor 2404. Depending on its applications, computing device 2400 may include other components that may or may not be physically and electrically coupled to motherboard 2402. These other components include, but are not limited to, volatile memory (for example, DRAM), non-volatile memory (for example, ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth), or the like.

Communication chips 2406 may enables wireless communications for the transfer of data to and from the computing device 2400. The term "wireless" and its derivatives may be used to describe circuits, devices, systems, methods, techniques, communications channels, and so forth, that may communicate data through the use of modulated electromagnetic radiation through a non-solid medium. The term does not imply that the associated devices do not contain any wires, although in some implementations they might not. Communication chips 2406 may implement any of a number of wireless standards or protocols, including but not limited to those described elsewhere herein. As discussed, computing device 2400 may include a plurality of communication chips 2406. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software logic, firmware logic and/or hardware logic configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth. For example, a module may be embodied in logic circuitry for the implementation via software, firmware, or hardware of the coding systems discussed herein.

As used in any implementation described herein, the term "logic unit" refers to any combination of firmware logic and/or hardware logic configured to provide the functionality described herein. The "hardware", as used in any implementation described herein, may include, for example, singly or in any combination, hardwired circuitry, programmable circuitry, state machine circuitry, and/or firmware that stores instructions executed by programmable circuitry. The logic units may, collectively or individually, be embodied as circuitry that forms part of a larger system, for example, an integrated circuit (IC), system on-chip (SoC), and so forth. For example, a logic unit may be embodied in logic circuitry for the implementation firmware or hardware of the coding systems discussed herein. One of ordinary skill in the art will appreciate that operations performed by hardware and/or firmware may alternatively be implemented via software, which may be embodied as a software package, code and/or instruction set or instructions, and also appreciate that logic unit may also utilize a portion of software to implement its functionality.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further implementations.

By one implementation, a semiconductor device may have a substrate with a (110) crystal orientation facing a channel flow direction, and a (110) upper surface. At least one p-type semiconductor body and at least one n-type semiconductor body both may be disposed on the substrate and both have at least initially strained semiconductor material comprising SiGe. The individual semiconductor bodies may have a channel region disposed between a source region and a drain region, while a strained cladding layer may be disposed on the channel region of at least one n-type semiconductor body and is made of silicon (Si). A gate dielectric layer may be disposed over the cladding layers, and a gate electrode may be disposed over the gate dielectric layers.

By other implementations, the semiconductor device may have semiconductor bodies that comprise a silicon (Si) lower portion extending from the substrate, have the crystal structure of the substrate, (100) crystal sidewall surfaces, and a silicon germanium (SiGe) upper portion formed atop the lower portion. Both the p-type and n-type semiconductor bodies comprise an upper portion that is substantially uniformly SiGe. The semiconductor device has at least one of: (1) no cladding layer existing on the p-type semiconductor bodies, and (2) the p-type semiconductor bodies have an inner region of Si, and wherein a layer of SiGe is disposed over the inner region, and wherein the p-type semiconductor bodies have a Si cladding layer on the layer of SiGe. The n-type semiconductor bodies have an upper portion with a SiGe inner core, and the p-type semiconductor devices have an upper portion with a Si inner core. The source and drain regions comprise at least one of: (a) the same material as the cladding layer on the same semiconductor body, and (b) a filler material disposed at a space formed by removing material from one or more source and/or drain regions of the semiconductor bodies, and wherein the semiconductor bodies have a relaxation causing free surface formed by the removal.

By one approach, a mobile computing platform comprises a microprocessor comprising a substrate with a (110) crystal orientation facing a channel flow direction, and a (110) upper surface. At least one p-type semiconductor body and at least one n-type semiconductor body both may be disposed on the substrate and both have at least initially strained semiconductor material comprising SiGe. The individual semiconductor bodies may have a channel region disposed between a source region and a drain region, while a strained cladding layer may be disposed on the channel region of at least one n-type semiconductor body and is made of silicon (Si). A gate dielectric layer may be disposed over the cladding layers, and a gate electrode may be disposed over the gate dielectric layers.

By other approaches, the microprocessor may have may have semiconductor bodies that comprise a silicon (Si) lower portion extending from the substrate, have the crystal structure of the substrate, (100) crystal sidewall surfaces, and a silicon germanium (SiGe) upper portion formed atop the lower portion. Both the p-type and n-type semiconductor bodies comprise an upper portion that is substantially uniformly SiGe. The microprocessor has at least one of: (1) no cladding layer existing on the p-type semiconductor bodies, and (2) the p-type semiconductor bodies have an inner region of Si, and wherein a layer of SiGe is disposed over the inner region, and wherein the p-type semiconductor bodies have a Si cladding layer on the layer of SiGe. The n-type semiconductor bodies have an upper portion with a SiGe inner core, and the p-type semiconductor devices have an upper portion with a Si inner core. The source and drain regions comprise at least one of: (a) the same material as the cladding layer on the same semiconductor body, and (b) a filler material disposed at a space formed by removing material from one or more source and/or drain regions of the semiconductor bodies, and wherein the semiconductor bodies have a relaxation causing free surface formed by the removal.

By one aspect, a method of fabricating a semiconductor device, comprises forming at least one p-type semiconductor body and at least one n-type semiconductor body over a substrate. The semiconductor bodies have a source region, a channel region, and a drain region. The method also comprises forming a lower portion of the semiconductor bodies comprising forming trenches in the substrate, and forming an upper portion of the semiconductor bodies on the lower portions and comprising strained silicon germanium (SiGe) with (110) crystal orientation facing a channel flow direction, a (110) upper facing surface, and at least at the channel region. The method also includes forming a silicon (Si) cladding layer on at least one of the n-type semiconductor bodies.

By other aspects, the method comprises having an upper portion formed with (100) sidewall surfaces, and forming at least one p-type semiconductor body and at least one n-type semiconductor body comprises at least one of: (A) forming a strained SiGe layer over the substrate, and forming trenches through the SiGe layer and into the substrate to form the p-type and n-type semiconductor bodies with a lower portion made of silicon and an upper portion made of SiGe; and (B) forming trenches in the substrate to form upstanding extensions having silicon, depositing an SiGe layer on the extensions, and transforming the Si extensions of at least the n-type semiconductor bodies into the upper portions comprising, at least in part, strained SiGe comprising moving the Ge of the SiGe layer into at least the upper portion while the extensions of the p-type-semiconductor bodies are covered by a protective removable cover. The method may also comprise transforming more of the Si extensions on the semiconductor bodies into the upper portions comprising strained SiGe comprising moving the Ge of the SiGe layer on the semiconductor bodies into the upper portions while the p-type semiconductor bodies are uncovered to form an upper portion of the n-type semiconductor bodies of SiGe substantially throughout the upper portion, and to form an upper portion of the p-type semiconductor bodies with an outer cladding layer of SiGe and an inner region of silicon.

The method also may comprise forming a silicon cladding layer on the p-type semiconductor bodies, where the transforming is performed by at least one of: annealing, and oxidation by rapid thermal oxidation (RTO). The method comprises at least one of: (a) maintaining a removable cover on the p-type semiconductor bodies while depositing the cladding layer on the n-type semiconductor bodies, and (b) removing cladding material from on the p-type semiconductor bodies resulting from depositing the cladding layer on the n-type semiconductor bodies. Depositing the removable cover comprises depositing a removable cover layer, forming an opening through the removable cover layer to expose at least part of n-type semiconductor bodies, and removing the cover layer after the SiGe layer is diffused at least partially onto the n-type semiconductor bodies. The method comprises forming a source and/or drain region on at least one of the semiconductor bodies, and with at least one of: (1) the same material as the cladding layer on the same semiconductor body, and (2) a filler material disposed at a space formed by removing material from one or more source and/or drain regions of the semiconductor devices. The semiconductor bodies have a relaxation causing free surface formed by the removal.

In a further example, a microprocessor may include an SRAM cache memory further having a transistor including any one of the above example structures.

In a still further example, a mobile computing platform may include any of the example structures.

It will be recognized that the invention is not limited to the implementations so described, but can be practiced with modification and alteration without departing from the scope of the appended claims. For example, the above implementations may include specific combination of features. However, the above implementations are not limited in this regard and, in various implementations, the above implementations may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

The invention claimed is:

1. A method for fabricating NMOS and PMOS FinFETs on a silicon substrate, the method comprising:
    forming a strained layer of silicon germanium onto the silicon substrate;
    depositing a mask layer onto the strained layer of silicon germanium;
    patterning the mask layer;
    selectively removing a patterned portion of the mask layer;
    selectively etching the silicon germanium and a depth of the underlying silicon substrate where the mask layer has been selectively removed, thereby forming fins where the mask layer has not been selectively removed and trenches where the mask layer has been selectively removed, the fins having a top portion comprising silicon germanium and a bottom portion comprising silicon;
    depositing an insulation layer within the trenches;
    forming a removeable cover layer over a first subset of the fins that are designated to become PMOS FinFETs, while leaving a second subset of the fins that are designated to become NMOS without the removeable cover layer;
    selectively forming a silicon cap layer over the second subset of the fins that are designated to become NMOS FinFETs.

2. The method of claim 1 wherein forming the strained layer of silicon germanium onto the silicon substrate comprises:
    epitaxially growing the strained layer of silicon germanium onto the silicon substrate.

3. The method of claim 1, wherein selectively forming a silicon cap layer over the second subset of the fins that are designated to become NMOS FinFETs comprises:
    epitaxially growing the silicon cap layer onto the second subset of the fins that are designated to become NMOS FinFETs, the method further comprising:
    removing the removeable cover layer formed over the first subset of the fins that are designated to become PMOS FinFETs.

4. The method of claim 1, wherein selectively forming a silicon cap layer over the second subset of the fins that are designated to become NMOS FinFETs comprises:
    epitaxially growing the silicon cap layer onto the second subset of the fins that are designated to become NMOS FinFETs.

5. The method of claim 1, further comprising:
    selectively forming a cap layer over the first subset of the fins that are designated to become PMOS FinFETs.

6. The method of claim 1, further comprising:
    providing doped source and drain regions for the first subset of the fins that are designated to become PMOS FinFETs.

7. The method of claim 6, wherein the doped source and drain regions for the first subset of the fins that are designated to become PMOS FinFETs comprise silicon germanium having a first germanium concentration higher than a second germanium concentration of the strained layer of silicon germanium formed onto the silicon substrate.

8. The method of claim 6, wherein the doped source and drain regions for the first subset of the fins that are designated to become PMOS FinFETs comprises germanium.

9. The method of claim 6, wherein providing doped source and drain regions for a first subset of the fins that are designated to become PMOS FinFETs comprises:
    etching source and drain portions of the first subset of the fins that are designated to become PMOS FinFETs; and
    depositing the doped source and drain portions of the first subset of the fins that are designated to become PMOS FinFETs.

10. The method of claim 9, wherein depositing doped source and drain portions of the first subset of the fins that are designated to become PMOS FinFETs comprising:
    epitaxially growing the doped source and drain portions of the first subset of the fins that are designated to become PMOS FinFETs.

11. The method of claim 1, further comprising:
    providing doped silicon source and drain regions for a second subset of the fins that are designated to become NMOS FinFETs.

12. The method of claim 11, wherein the doped source and drain regions for the second subset of the fins that are designated to become NMOS FinFETs comprise silicon.

13. The method of claim 11, wherein providing doped source and drain regions for a second subset of the fins that are designated to become NMOS FinFETs comprises:
    etching source and drain portions of the second subset of the fins that are designated to become NMOS FinFETs; and
    depositing the doped source and drain portions of the second subset of the fins that are designated to become NMOS FinFETs.

14. The method of claim 13, wherein depositing doped source and drain portions of the second subset of the fins that are designated to become NMOS FinFETs comprising:
    epitaxially growing the doped source and drain portions of the second subset of the fins that are designated to become NMOS FinFETs.

15. The method of claim 1, further comprising:
    forming a gate dielectric onto body portions of the fins; and
    depositing a gate electrode onto the gate dielectric.

16. The method of claim 15, wherein forming a gate dielectric onto body portions of the fins comprises:
    depositing a high-k dielectric onto the body portions of the fins.

17. The method of claim 1, wherein the substrate is a silicon substrate with a top surface crystal orientation of (110).

* * * * *